United States Patent [19]
Zhou et al.

[11] Patent Number: 6,064,205
[45] Date of Patent: May 16, 2000

[54] CORRECTION OF ARTIFACTS CAUSED BY MAXWELL TERMS IN SLICE OFFSET ECHO PLANAR IMAGING

[75] Inventors: Xiaohong Zhou; Yiping Du, both of Pewaukee; Matthew A. Bernstein, Waukesha; Hammond G. Reynolds; Joseph K. Maier, both of Milwaukee; Jason A. Polzin, Lake Mills, all of Wis.

[73] Assignee: General Electric Company, Milwaukee, Wis.

[21] Appl. No.: 09/265,259

[22] Filed: Mar. 9, 1999

Related U.S. Application Data

[62] Division of application No. 08/877,384, Jun. 17, 1997.

[51] Int. Cl.$^7$ ........................................... G01V 3/00
[52] U.S. Cl. ............................. 324/309; 324/307
[58] Field of Search ............................. 324/309, 300–322

[56] References Cited

U.S. PATENT DOCUMENTS

| | | | |
|---|---|---|---|
| 5,541,513 | 7/1996 | Maier et al. | 324/309 |
| 5,689,186 | 11/1997 | Maier et al. | 324/309 |
| 5,869,965 | 2/1999 | Du et al. | 324/309 |
| 5,923,168 | 7/1999 | Zhou et al. | 324/309 |
| 5,926,022 | 7/1999 | Slavin et al. | 324/309 |

*Primary Examiner*—Christine K. Oda
*Assistant Examiner*—Tiffany A. Fetzner
*Attorney, Agent, or Firm*—Barry E. Sammons; Christian G. Cabou; Phyllis Y. Price

[57] ABSTRACT

Two methods are disclosed to remove the image artifacts produced by Maxwell terms arising from the imaging gradients in an echo planar imaging pulse sequence. In the first method, the frequency and phase errors caused by the Maxwell terms are calculated on an individual slice basis and subsequently compensated during data acquisition by dynamically adjusting the receiver frequency and phase. In the second method, two linear phase errors, one in the readout direction and the other in the phase-encoding direction, both of which arise from the Maxwell terms, are calculated on an individual-slice basis. These errors are compensated for in the k-space data after data acquisition.

7 Claims, 3 Drawing Sheets

CORRECTION OF ARTIFACTS CAUSED BY MAXWELL TERMS IN SLICE OFFSET ECHO PLANAR IMAGING

RELATED APPLICATIONS

This application is a division of U.S. patent application Ser. No. 08/877,384 filed on Jun. 17, 1997 and entitled "CORRECTION OF ARTIFACTS CAUSED BY MAXWELL TERMS IN SLICE OFFSET ECHO PLANAR IMAGING" which issued on Jul. 13, 1999 as U.S. Pat. No. 5,923,168.

BACKGROUND OF THE INVENTION

The field of the invention is nuclear magnetic resonance imaging methods and systems. More particularly, the invention relates to the correction of image artifacts caused by "Maxwell terms" produced by imaging gradients in MRI systems.

When a substance such as human tissue is subjected to a uniform magnetic field (polarizing field $B_0$), the individual magnetic moments of the spins in the tissue attempt to align with this polarizing field, but precess about it at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that imperfections in the linear magnetic field gradients ($G_x$, $G_y$, and $G_z$) produce artifacts in the reconstructed images. It is a well known problem, for example, that eddy currents produced by gradient pulses will distort the magnetic field and produce image artifacts. Methods for compensating for such eddy current errors are also well known as disclosed, for example, in U.S. Pat. Nos. 4,698,591; 4,950,994; and 5,226,418.

It is also well known that the gradients may not be perfectly uniform over the entire imaging volume, which may lead to image distortion. Methods for compensating this non-uniformity are well known, and for example, are described in U.S. Pat. No. 4,591,789.

Other than uncompensated eddy current errors and gradient non-uniformity errors that escape correction, it can be assumed that the magnetic field gradients ($G_x$, $G_y$, and $G_z$) produce linear magnetic fields exactly as programmed, thus spatially encoding the NMR data accurately. With these gradients, the overall magnetic field at location (x,y,z) is conventionally given as $B_0 + G_x x + G_y y + G_z z$, and the direction of the field is usually thought to be along the z-axis. This description, however, is not exactly correct. As long as a linear magnetic field gradient is applied, the overall magnetic field is nutated away from the z-axis and its amplitude exhibits higher-order spatial dependencies ($x^2$, $y^2$, $z^2$, $x^2 z$, . . .). These phenomena are a direct consequence of the Maxwell equations which require that the overall magnetic field satisfy the following two conditions: $\vec{\nabla} \cdot \vec{B} = 0$ and $\vec{\nabla} \times \vec{B} = 0$ (assuming the true and displacement current densities are zero). The higher-order magnetic fields, referred to as "Maxwell terms" (or Maxwell fields), represent a fundamental physics effect, and are not related to eddy currents or imperfection in hardware design and manufacture. Although Maxwell terms have been known for at least a decade, their effect on imaging has been largely ignored because of their negligible effect under conventional imaging conditions.

In axial echo planar imaging (EPI) carried out in a horizontal field magnet, it has been observed that the image in an off-center slice ($z \neq 0$) can shift along the phase-encoded direction. The amount of the shift ($\Delta y$) is proportional to the square of the slice location z ($\Delta y\ z^2$). This parabolic shift can cause image misregistration problems in neuro-functional imaging, where activation maps obtained from EPI images are overlaid onto a high resolution non-EPI image to establish the correlation between brain function and anatomy. Even in non-functional imaging, the shift can confuse clinical diagnosis and therapeutic planning, especially when the axial 2D slices are reformatted into arbitrary planes. Clearly, the source of this shift needs to be identified, and methods to remove the shift need to be developed.

SUMMARY OF THE INVENTION

The present invention is a method for reducing artifacts in off-center EPI images caused by Maxwell terms produced by the readout gradient. More specifically, a phase shift ($\phi$) and a frequency shift ($\Delta f$) are calculated for each NMR echo signal in an EPI pulse sequence based on the imaging gradient waveforms, the main field, and the slice location. These calculated values are either used to control the phase and frequency of the rf reference signal applied to the receiver as these NMR echo signals are received, or applied to the acquired signals (k-space data) during image reconstruction to remove the artifacts.

In axial echo planar imaging (EPI) carried out in a horizontal field magnet (e.g. a superconducting magnet), an image in an off-center slice can shift along the phase-encoded direction. The amount of the shift ($\Delta y$) is proportional to the square of the slice location z ($\Delta y\ z^2$). This phenomenon, which we call parabolic shift, is caused by the $z^2$-Maxwell term arising mainly from the EPI readout gradient. The parabolic shift, although most frequently encountered in axial images in a horizontal field magnet, can also be observed in off-center sagittal and coronal slices. For certain magnets whose magnetic field corresponds to the anterior/posterior direction of the patient, the parabolic shift is most visible in the coronal planes. In addition to the parabolic shift, Maxwell terms can also produce a Nyquist ghost whose intensity is proportional to the difference of two images shifted in opposite directions.

We have developed two techniques which remove the parabolic shift as well as the Nyquist ghost caused by the Maxwell term. In the first technique, frequency and phase errors caused by the Maxwell terms are calculated analytically on an individual-slice and an individual-echo basis. The calculated errors are then compensated by adjusting the receiver frequency and phase during data acquisition. In the second technique, the frequency and phase errors are first converted to two linear phase shifts in the k-space data, one in the readout direction and the other in the phase-encoding direction. The linear phase shifts are removed in the image reconstruction process after data acquisition.

GENERAL DESCRIPTION OF THE INVENTION

Figure 1:
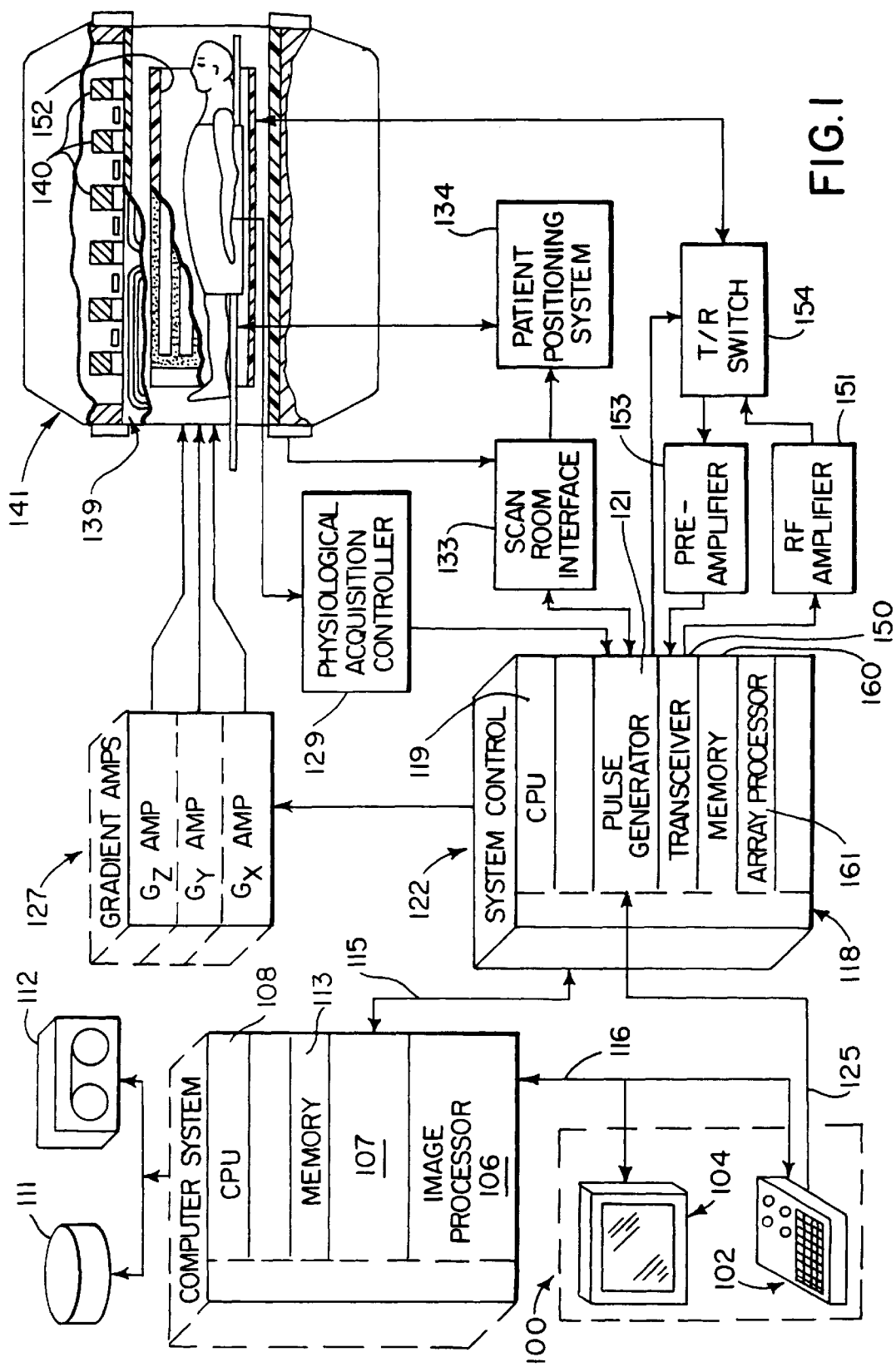
FIG. 1 is a block diagram of a known MRI system which is modified to employ the present invention.

The Maxwell terms are basically the higher-order spatial gradients (second order, third order, etc.) produced by the linear magnetic field gradients (x, y, and z-gradients). These terms can be directly derived from the Maxwell equations. According to the Maxwell equations, a magnetic field $\vec{B}$ must satisfy the following two conditions:

$$\vec{\nabla} \cdot \vec{B} = 0 \quad \text{(divergence equation)}, \tag{1a}$$

$$\vec{\nabla} \times \vec{B} = \mu_0 \epsilon_0 \frac{\partial \vec{E}}{\partial t} + \mu_0 \vec{J} \quad \text{(curl equation)}, \tag{1b}$$

where $\vec{\nabla}$ is the derivative operator ($\vec{\nabla} \equiv \hat{i}\partial/\partial x + \hat{j}\partial/\partial y + \hat{k}\partial/\partial z$), $\vec{E}$ is the electric field, $\vec{J}$ is the current density, and $\mu_0$ and $\epsilon_0$ are the magnetic permeability and the electric permeability of the free space, respectively. If there is no displacement current and the electric field is static, equation 1b reduces to:

$$\vec{\nabla} \times \vec{B} = 0. \tag{1c}$$

From equations 1a and 1c, we obtain:

$$\frac{\partial B_x}{\partial x} + \frac{\partial B_y}{\partial y} + \frac{\partial B_z}{\partial z} = 0, \tag{2}$$

$$\frac{\partial B_x}{\partial y} = \frac{\partial B_y}{\partial x}, \tag{3a}$$

$$\frac{\partial B_y}{\partial z} = \frac{\partial B_z}{\partial y}, \tag{3b}$$

$$\frac{\partial B_z}{\partial x} = \frac{\partial B_x}{\partial z}. \tag{3c}$$

The above 4 equations 2 and 3a–c contain a total of 9 partial derivatives, among which only 5 are independent. Our next task is to select these five independent variables. Recognizing that $$\frac{\partial B_x}{\partial x} \equiv G_x, \quad \frac{\partial B_z}{\partial y} \equiv G_y, \text{ and } \frac{\partial B_z}{\partial z} \equiv G_z$$

($G_x$, $G_y$, and $G_z$ are the linear gradients), we can readily choose $G_x$, $G_y$, and $G_z$ as the first three independent variables. For a radially symmetric $G_z$-field in cylindrical coordinates $\partial B_x/\partial x$ and $\partial B_y/\partial y$ should be identical. However, to cover a more general case, we choose a dimensionless symmetry parameter $\alpha$ as the fourth independent variable:

$$\alpha \equiv -\frac{\partial B_x/\partial x}{G_z}, \quad 1 - \alpha \equiv -\frac{\partial B_y/\partial y}{G_z}. \tag{4a-b}$$

The last independent variable can be conveniently chosen as (based on equation 3a):

$$g \equiv \frac{\partial B_x}{\partial y} = \frac{\partial B_y}{\partial x}. \tag{5}$$

At this point, all the partial derivatives described in equations 2 and 3 can be expressed using the 5 independent variables $G_x$, $G_y$, $G_z$, $\alpha$, and g:

$$\begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} = \begin{bmatrix} -\alpha G_z & g & G_x \\ g & -(1-\alpha)G_z & G_y \\ G_x & G_y & G_z \end{bmatrix} \tag{6}$$

With all the terms, the overall magnetic field becomes:

$$\hat{B} = \hat{i}B_x + \hat{j}B_y + \hat{k}B_z, \tag{7}$$

where, to first order, $$\begin{bmatrix} B_x \\ B_y \\ B_z - B_0 \end{bmatrix} = \begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} \begin{bmatrix} x \\ y \\ z \end{bmatrix} = \tag{8}$$

$$\begin{bmatrix} -\alpha G_z & g & G_x \\ g & -(1-\alpha)G_z & G_y \\ G_x & G_y & G_z \end{bmatrix} \begin{bmatrix} x \\ y \\ z \end{bmatrix}$$

The above equations have two important implications. First, the $B_0$-field is no longer aligned along the z-axis because of the transverse fields $B_x$ and $B_y$. Second, the amplitude of the $B_0$ field is not simply given by $B = B_0 + G_x x + G_y y + G_z z$, but instead by $$B(x, y, z) = \sqrt{B_x^2 + B_y^2 + B_z^2} \tag{9}$$

($B_0 + G_x x + G_y y + G_z z$ merely represents the z-component of the overall field). If we perform three sequential Taylor series expansions on equation 9 with respect to x, y, and z, respectively, it can be seen that the magnetic field not only has its regular zeroth and first order spatial dependencies, but also shows higher-order spatial components. The result of the Taylor expansion to the second order is given by equation 10:

$$B = B_0 + G_x x + G_y y + G_z z + \frac{1}{2B_0}[\alpha^2 G_z^2 + g^2]x^2 + \tag{10}$$

$$\frac{1}{2B_0}[(1-\alpha)^2 G_z^2 + g]y^2 + \frac{1}{2B_0}[G_x^2 + G_y^2]z^2 - \frac{gG_z}{B_0}xy +$$

$$\frac{1}{B_0}[gG_x - (1-\alpha)G_yG_z]yz + \frac{1}{B_0}[gG_y - \alpha G_xG_z]xz$$

For most gradient systems used in MRI, we have g=0, and $\alpha \approx \frac{1}{2}$ (due to the cylindrical symmetry). Under these conditions, equation 10 is simplified to:

$$B = B_0 + G_x x + G_y y + G_z z + \frac{1}{8B_0}G_z^2 x^2 + \frac{1}{8B_0}G_z^2 y^2 + \quad (11)$$
$$\frac{1}{2B_0}[G_x^2 + G_y^2]z^2 - \frac{1}{2B_0}G_yG_z yz - \frac{1}{2B_0}G_xG_z xz$$

Equations 10 and 11 indicate that, whenever a linear magnetic field gradient is applied, higher-order gradient fields will be produced to satisfy the Maxwell equations. These higher-order gradient fields are referred to as the "Maxwell terms", or "Maxwell fields." With the inclusion of the Maxwell terms, the 2D NMR signal equation becomes:

$$S(k_x, k_y) = \int_x \int_y \rho(x,y) e^{-i(k_x x + k_y y)} e^{-i\phi_M} dx\, dy, \quad (12a)$$

$$\phi_M = \gamma \int_t B_M(G_x, G_y, G_z, x, y, z) dt, \quad (12b)$$

$$B_M = \frac{1}{8B_0}G_z^2 x^2 + \frac{1}{8B_0}G_z^2 y^2 + \quad (12c)$$
$$\frac{1}{2B_0}[G_x^2 + G_y^2]z^2 - \frac{1}{2B_0}G_yG_z yz - \frac{1}{2B_0}G_xG_z xz.$$

where $B_M$ is the Maxwell magnetic field and $\phi_M$ is the associated phase error. As implied by equations 12a–c, the Maxwell phase error depends on the details of each pulse sequence. In some pulse sequences, the phase error can be negligible or zero and thus causes no image degradation. In most other sequences, a non-negligible phase error is produced, giving various image quality problems such as distortion, ghosting, image shift, shading, blurring, and intensity reduction.

In axial EPI carried out in a horizontal field magnet, the readout gradient $\vec{G}_{ro}$ can be applied along either x or y-axis. For a general case, $\vec{G}_{ro}$ can be expressed as:

$$\vec{G}_{ro} = \hat{i}G_x + \hat{j}G_y, \quad (13a)$$

$$|\vec{G}_{ro}| \equiv G_{ro} = \sqrt{G_x^2 + G_y^2}, \quad (13b)$$

where $\hat{i}$ and $\hat{j}$ are unit vectors in the $G_x$ and $G_y$ directions, respectively. Note that equation 13a also accounts for oblique scans, although we rarely use oblique scans in the axial plane. According to equation (11), the $z^2$-Maxwell term produced by the $G_x$ and/or $G_y$ gradients is given by:

$$B_M = \frac{1}{2B_0}(G_x^2 + G_y^2)z^2, \quad (14)$$

where $B_0$ is the main magnetic field. Combining equations 13b and 14, we obtain:

$$B_M = \frac{1}{2B_0}G_{ro}^2 z^2. \quad (15)$$

The Maxwell field $B_M$ vanishes at the central slice (z=0), provided the slice is infinitesimally thin. For off-center slices, however, $B_M$ increases parabolically with respect to the slice location z. Such a quadratic magnetic field has two consequences.

First, the Larmor resonance frequency of the spins is shifted away from the pre-set receiver demodulation frequency (Eq. 16), leading to a spatial shift along the readout direction (Eq. 17):

$$\Delta f(z) = \gamma B_M(z), \quad (16)$$

$$\delta_{ro}(z) = \frac{\Delta f(z)}{\gamma G_{ro}} = \frac{1}{2B_0}G_{ro}z^2. \quad (17)$$

Since the readout gradient is bipolar, the spatial shift $\delta_{ro}$ alternates between the odd and even echoes, producing a Nyquist ghost which is the difference between two shifted images in the opposite directions (i.e., $\pm\delta_{ro}$) along the readout direction. This effect is due to the use of the bipolar readout gradient. If we use $G_{ro}$=2.2G/cm, z=24 cm and $B_0$=1.5T, the maximum ghost-to-image intensity ratio is found to be 0.5%.

Second, the $z^2$-Maxwell term introduces a cumulative phase shift at each echo acquisition throughout the echo train. The phase at the center of echo m is given as:

$$\phi(m,z) = \int_{t_s}^{t_m} \gamma B_M dt \quad (18)$$

where $t_m$ is the time at the center of the mth echo, and $t_s$ is the time when the readout gradient (including pre-phasing gradient) is first activated. For a periodic readout gradient $G_{ro}$, equation 18 can be expressed as:

$$\phi(m,z) = \phi_p(z) - \frac{\lambda(z)}{2} + m\lambda(z), \quad (19)$$

where $$\lambda(z) = \frac{\gamma z^2}{2B_0}\int_0^{t_{esp}} G_{ro}^2 dt, \quad (19a)$$

Figure 3:
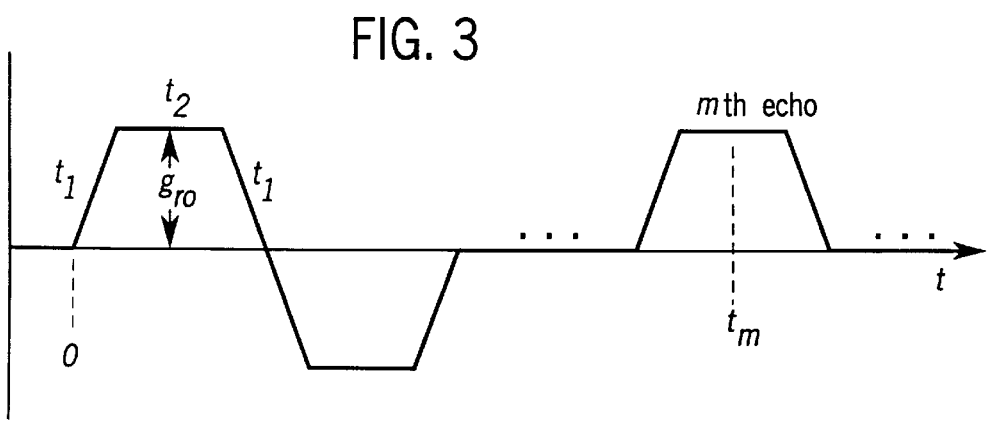
FIG. 3 is a graphic representation of readout gradient used in an EPI pulse sequence.

$t_{esp}$ is the inter-echo spacing, and $\phi_p(z)$ is the Maxwell phase introduced by the pre-phasing readout gradient. For a trapezoidal readout gradient train illustrated in FIG. 3, $\lambda(z)$ can be explicitly expressed as:

$$\lambda(z) = \frac{\gamma g_{ro}^2 z^2}{2B_0}\left(\frac{2}{3}t_1 + t_2\right), \quad (19b)$$

where $g_{ro}$, $t_1$ and $t_2$ are defined in FIG. 3. In single-shot EPI, consecutive m values correspond to consecutive k-space lines along the phase-encoding direction. Thus, the phase in equation 19 represents a linear phase in the k-space, which gives a shift $\delta_{pe}$ in the image domain according to the shift theorem of Fourier transform:

$$\delta_{pe,ss}(z) = \frac{L_{pe}}{2\pi}\lambda(z), \tag{20}$$

where $L_{pe}$ is the field-of-view (FOV) in the phase-encoding direction. If we choose $g_{ro}$=2.2G/cm, z=24 cm, $B_0$=1.5T, $t_1$=184 $\mu$s, and $t_2$=512 $\mu$s (corresponding to a receiver bandwidth of ±125 kHz for 128 readout data points), we find that $\delta_{pe}$=0.251$L_{pe}$, a shift of more than a quarter of the FOV! For multi-shot EPI with N shots, equation 20 becomes:

$$\delta_{pe,ms}(z) \approx \frac{L_{pe}}{2\pi N}\lambda(z). \tag{21}$$

Even in this case, the shift along the phase-encoding direction can be substantial.

To summarize, the $z^2$-Maxwell term produced by the readout gradient in axial EPI scans can cause a Nyquist ghost and an image shift along the phase-encoding direction. Although the level of the ghost could be negligible, the image shift is substantial. Since the amount of the shift is quadratically proportional to the slice location and the readout gradient, and inversely proportional to the static magnetic field, increasing the slice offset or the readout gradient, or decreasing the main magnetic field can aggravate the parabolic shift problem.

To remove the parabolic shift, as well as the Nyquist ghost, we have developed two techniques, a compensation technique during data acquisition and a post-acquisition correction technique during image reconstruction.

In the first technique the frequency and phase errors are first calculated from equations 16–19 for each echo m and for each slice located at z. These errors are compensated by dynamically adjusting the receiver frequency and phase on an individual-echo, individual-slice basis while the data acquisition proceeds. The frequency and phase compensation values are: $\Delta f_{comp}(z)$=-$\Delta f(z)$, and $\phi_{comp}(m,z)$=-$\phi(m,z)$, respectively, where $\Delta f(z)$ and $\phi(m,z)$ are respectively given by equations 16 and 19.

In the second technique, the echo signals are first acquired in the presence of the frequency and phase errors. After data acquisition, a linear phase shift $\psi_{ro}(z)$ given by equation 22 is applied along the readout direction to correct for the frequency error (equation 16), and another linear phase shift $\psi_{pe}(z)$=-$\lambda(z)$ is applied along the phase-encoding direction to remove the phase error (equation 19).

$$\psi_{ro}(z) = -\frac{2\pi}{L_{ro}}\delta_{ro} = -\frac{\pi}{B_0 L_{ro}}G_{ro}z^2 \tag{22}$$

($L_{ro}$ is the FOV in the readout direction). For multi-shot EPI, equation 22 remains the same, but the linear phase shift along the phase-encoding direction must be done with respect to a group of k-space lines, instead of individual ones. It is interesting to note that the polarity of the linear phase shift along the readout direction alternates with the readout gradient polarity, as indicated by equation 22.

The above methods to remove the parabolic shift and the Nyquist ghost assume that the $z^2$-Maxwell term mainly arises from the EPI readout gradient. This is generally a good approximation since the phase-encoding gradient blip is significantly smaller than its readout counterpart and is only active for a brief period of time. In cases where the Maxwell term due to the phase-encoding gradient becomes significant, such as multi-shot EPI with a large number of shots, equations 15 and 19a should be respectively modified as follows:

$$B_M = \frac{1}{2B_0}(G_{ro}^2 + G_{pe}^2)z^2, \tag{23}$$

$$\lambda(z) = \frac{\gamma z^2}{2B_0}\int_0^{t_{esp}}[G_{ro}^2(t) + G_{pe}^2(t)]dt, \tag{24}$$

where $G_{pe}$ is the phase-encoding gradient waveform. Although we did not consider the phase-encoding gradient in the above discussion, inclusion of this gradient is straightforward and only involves minor changes.

Although the Maxwell term induced parabolic shifts and ghosts are most evident in axial slices for a horizontal field magnet, similar problems can also be observed in sagittal and coronal images. For example, in a coronal image (xz-plane) acquired using $G_z$ as the readout gradient, the corresponding Maxwell term becomes:

$$B_M = \frac{G_z^2 x^2}{8B_0} + \frac{G_z^2 y^2}{8B_0}. \tag{25}$$

The first term in equation 25 causes in-plane image distortion (R. M. Weiskoff, et al., Magnetic Resonance in Medicine, Vol. 29, 796–803, 1993), and the second term generates a quadratic phase along the slice-selection direction (y-direction), resulting in parabolic shifts and ghosts similar to those discussed for axial images. All the theoretical analyses and correction methods presented for axial images are equally applicable to coronal and sagittal images, except that the coefficient of the Maxwell term is four times smaller. It is interesting to note that when the readout gradient is chosen along x-axis in a coronal image, no quadratic Maxwell field along the y-direction is produced. Therefore, the image does not experience parabolic shift and ghosting. The same argument is also true for sagittal images with the readout direction along the y-axis.

In the analysis of the Maxwell terms, we have assumed a horizontal field magnet configuration. When a vertical field magnet is used, the physical z-axis is changed to the anterior-posterior direction of the patient. Therefore, the coronal images, instead of axial ones, will exhibit the most prominent parabolic shift and ghosting. The same principles to correct for the artifacts presented for axial slices in horizontal field magnet are equally applicable to this case with only minor notational changes.

Although we have employed an EPI pulse sequence with a trapezoidal readout gradient as an example in the above discussions, it should be understood that the present invention can be practiced in other EPI pulse sequences, and other sequences employing bipolar readout gradients for multiple echo acquisitions. For example, the trapezoidal readout gradient in FIGS. 3 and 4 can be replaced by a sinusoidal gradient. Even for trapezoidal gradients, data acquisition is not limited to the flat-top and can be acquired while the gradient ramps up or down. In these cases, equations (16) and (19a) can still be used to calculate the frequency and phase errors with the understanding that $\Delta f(z)$ in equation (16) now becomes time-dependent: $\Delta f(z,t)$. Another variation of the EPI pulse sequence is the so called "skip-echo" EPI where only odd or even echoes are acquired when the readout gradient lobes have the same polarity. All the above equations derived for correcting the Maxwell-field induced artifacts are still valid for skip-echo EPI since we have defined $t_{esp}$ as the inter-echo spacing (i.e., the time interval between two consecutively acquired echoes), instead of the time interval between the positive and negative gradient lobes. Echo planar imaging may also be combined with the fast spin echo technique to acquire multiple gradient echoes within multiple spin echoes. The correction methods, presented in equations (15)–(24), are equally applicable to this imaging technique. Description Of The Preferred Embodiment Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, amplitude and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an image data set. This image data set is conveyed through the serial link 115 to the computer system 107 where it is stored in the disk memory 111. In response to commands received from the operator console 100, this image data set may be archived on the tape drive 112, or it may be further processed by the image processor 106 and conveyed to the operator console 100 and presented on the display 104.

Figure 2:
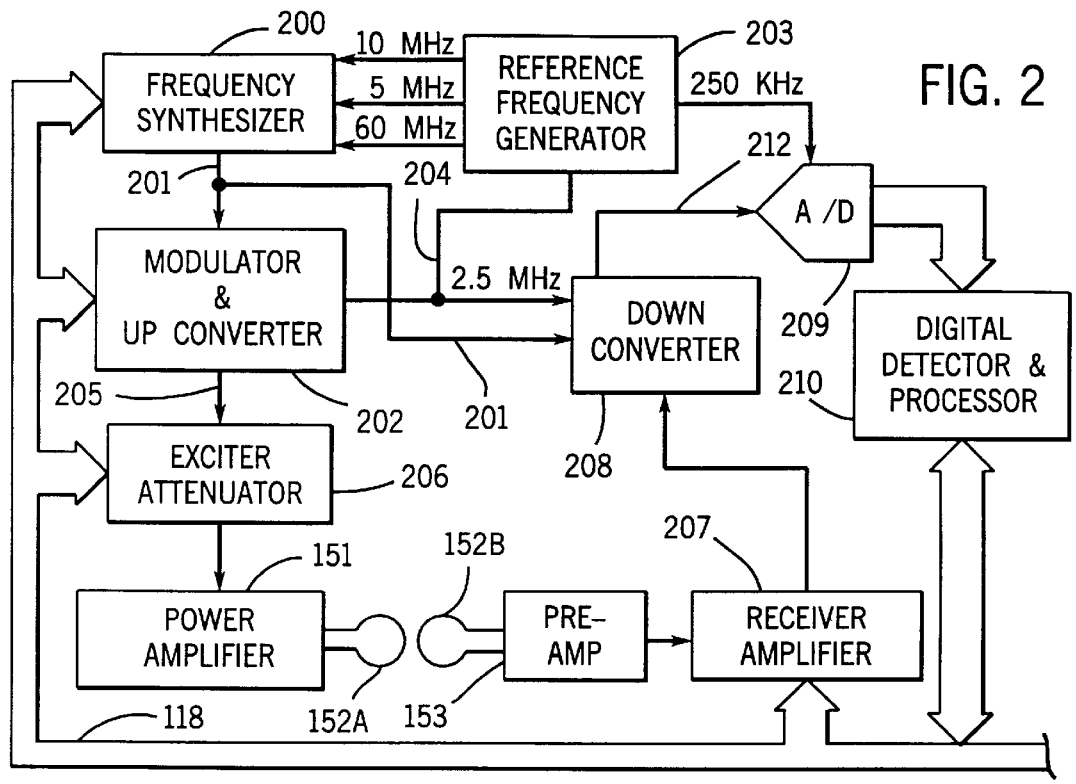
FIG. 2 is an electrical block diagram of a known transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877.

Referring still to FIG. 1 and 2 the signal produced by the subject is picked up by the receiver coil 152B and applied through the preamplifier 153 to the input of another receiver amplifier 207. The receiver amplifier 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

Figure 4:
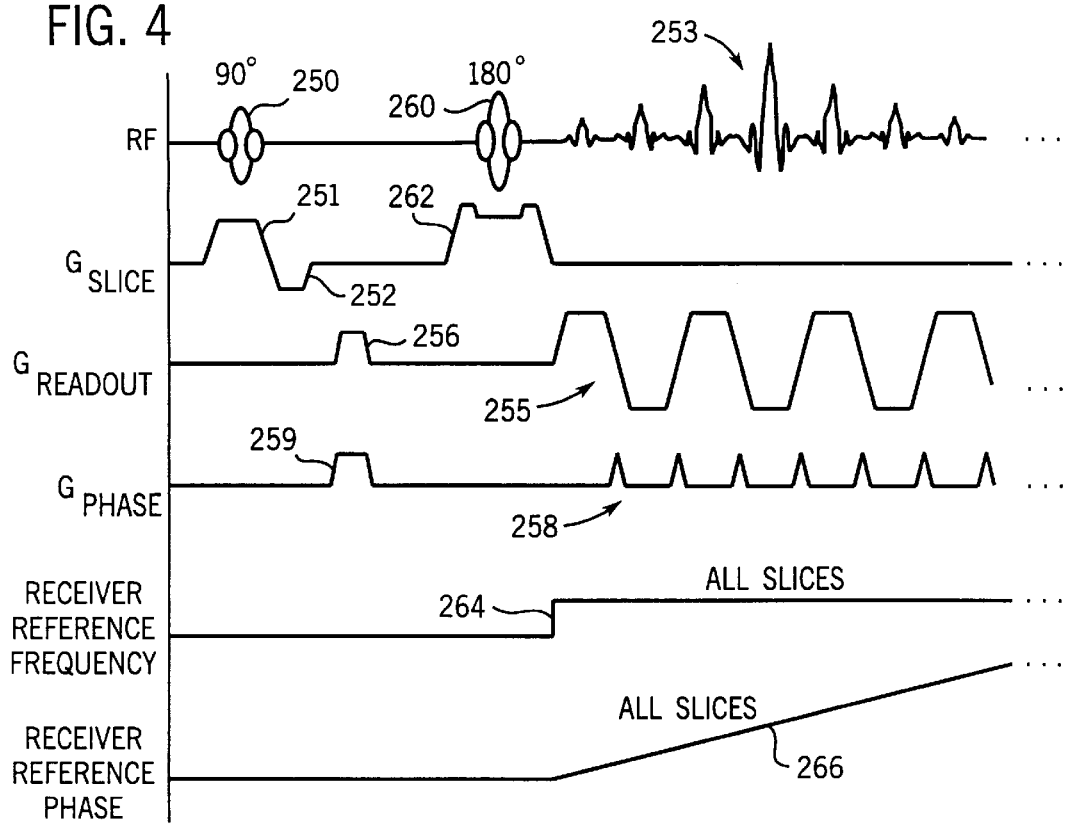
FIG. 4 is a graphic representation of an EPI pulse sequence to which the present invention applies.

The EPI pulse sequence employed in the preferred embodiment of the invention is illustrated in FIG. 4. A 90° RF excitation pulse 250 is applied in the presence of a slice-selection gradient pulse 251 to produce transverse magnetization in a slice. The excited spins are rephased by a negative lobe 252 on the slice-selection gradient and then a time interval elapses before a 180° RF refocusing pulse 260 is applied in the presence of a slice-selection gradient pulse 262, surrounded by crusher gradients. A total of $N_y$ (e.g., $N_y$=128) separate NMR echo signals, indicated at 253 are acquired during the EPI pulse sequence.

The NMR echo signals 253 are gradient recalled echoes produced by the application of an oscillating readout gradient 255. The readout sequence is started with a pre-phasing readout gradient lobe 256 and the echo signals 253 are produced as the readout gradient oscillates between positive and negative values. A total of $N_x$ (e.g., $N_x$=128) samples are taken of each NMR echo signal 253 during each readout gradient pulse 255. The successive $N_y$ NMR echo signals 253 are separately phase encoded by a series of phase encoding gradient pulses 258. A pre-phasing phase-encoding lobe 259 occurs before the echo signals acquired to position the central view ($k_y$=0) at the desired echo time (TE). Subsequent phase encoding pulses 258 occur as the readout gradient pulses 255 switch polarity, and they step the phase encoding monotonically upward through $k_y$-space.

At the completion of the EPI pulse sequence, therefore, $N_x$ separate frequency encoded samples of $N_y$ separately phase encoded NMR echo signals 253 have been acquired. After time reversing every other echo, this $N_x \times N_y$ element array of complex numbers is Fourier transformed along both of its dimensions ($k_y$ and $k_x$) to produce an image data set that indicates the NMR signal magnitude along each of its two dimensions (x and y).

Referring still to FIG. 4, during a conventional EPI pulse sequence the receiver reference signal used to demodulate the NMR signals 253 is set to a fixed frequency as indicated at 264 and its phase accumulates at a fixed rate as indicated at 266. As shown in FIG. 2, the 2.5 MHz reference signal as well as the 250 kHz sampling signal and the 5, 10 and 60 MHz reference signals are produced by a reference frequency generator 203 from a common 20 MHz master clock signal.

Figure 5:
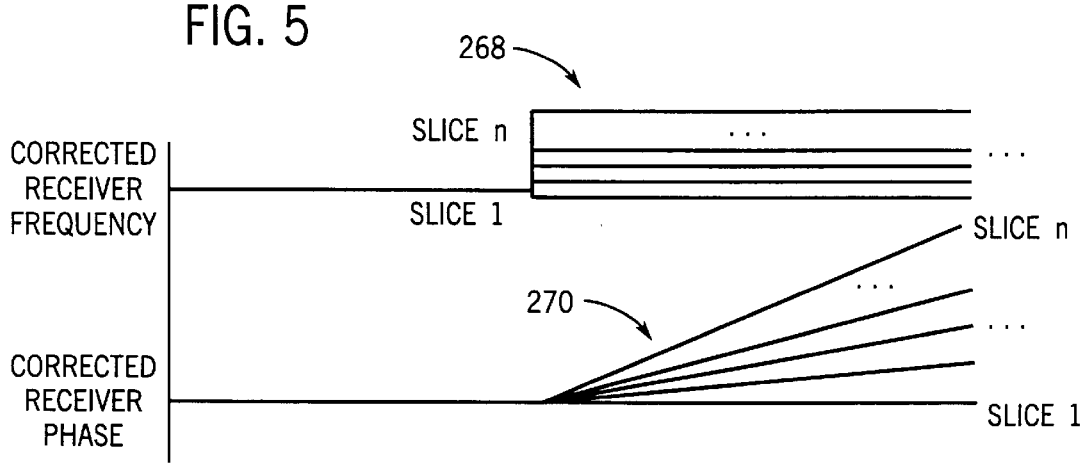
FIG. 5 is a graphic representation of the changes made to the pulse sequence of FIG. 4 to practice the first preferred method of the present invention.

One way the present invention is implemented is by controlling the frequency and phase of the 2.5 MHz reference signal on line 201 to correct for the frequency shift $\Delta f(z)$ given in equation (16) and the cumulative phase shift given in equation (19). Referring to FIGS. 4 and 5, after the RF pulses 250 and 260 are produced during the EPI pulse sequence, the frequency and phase of the 2.5 MHz reference signal on line 201 is controlled by command signals from the pulse generator module 121 to make the corrective changes as the readout gradient 255 is played out. The amount of this correction depends on the location of the slice along the z-axis, and hence the amount of the corrections $\Delta f(z)$ and $\phi(m,z)$ will be different for each slice (1 through n) in a multi-slice acquisition. This is indicated in FIG. 5 by the different levels of the receiver frequency at 268 and the different rates of phase accumulation at 270.

The other way the present invention can be implemented is by first calculating the two linear phase shifts $\psi_{ro}(z)$ and $\psi_{pe}(z)$ for individual slices, as discussed earlier. The linear phase shifts are then respectively applied to the readout and the phase-encoding directions of the complex k-space data. After the phase correction, a 2D Fourier transform on the k-space data produces an image where the parabolic shifts and ghosts caused by the Maxwell terms are removed.

We claim:

1. Method for correcting Maxwell term errors produced by imaging gradients in an NMR system during the acquisition of an NMR image slice using an echo-planar pulse sequence, the steps comprising:

a) performing the echo planar pulse sequence by
   i) producing one or more RF pulses;
   ii) producing a readout gradient which alternates in polarity to produce a corresponding series of NMR gradient echo signals;
   iii) producing a phase-encoding gradient to individually spatial-encode the said name echo signals;
   iv) receiving each of said NMR echo signals; and
   v) storing the NMR echo signal;

b) calculating a linear phase correction value $\psi_{ro}(z)$ in the readout direction for each image slice located at position z along a z axis;

c) calculating a linear phase correction value $\psi_{pe}(z)$ in the phase-encoding direction for each image slice located at position z along the z axis;

d) applying a linear phase correction $\psi_{ro}(z)$ to the stored NMR echo signals along the readout direction;

e) applying a linear phase correction $\psi_{pe}(z)$ to the stored NMR echo signals along the phase-encoding direction; and f) reconstructing an image from the corrected NMR echo signals; and in which the value of the linear phase correction value $\psi_{ro}(z)$ is a function of the readout gradient amplitude and the value of the linear phase correction value $\psi_{pe}(z)$ is a function of both the readout gradient and phase-encoding gradient amplitudes.

2. The method as recited in claim 1 in which the linear phase correction $\psi_{ro}(z)$ is calculated by:

$$\psi_{ro}(z) = -\frac{\pi}{B_0 L_{ro}} G_{ro} z^2$$

where:

$G_{ro}$=readout gradient
$B_0$=main magnetic field strength
$L_{ro}$=field of view in the readout direction
z=slice location along the z-axis
π=3.1415926.

3. The method as recited in claim 1 which the linear phase correction $\psi_{pe}(z)$ is calculated by:

$$\psi_{pe}(z) = -\lambda(z),$$

where:

$$\lambda(z) = \frac{\gamma z^2}{2 B_0} \int_0^{t_{esp}} (G_{ro}^2(t) + G_{pe}^2(t)) dt,$$

$G_{ro}(t)$=readout gradient
$G_{pe}(t)$=phase-encoding gradient
$t_{esp}$=inter-echo spacing for the periodic readout gradient
$B_0$=main magnetic field strength
z=slice location along z axis
γ=gyromagnetic constant.

4. An NMR system for producing an image slice using an echo-planar pulse sequence that produces a series of NMR signals;
- receiver means which receives the NMR signals and stores them in a memory;
- means for calculating a linear phase correction value $\psi_{ro}(z)$ in a readout gradient direction which is a function of the square of the image slice location z along a z axis and a readout gradient amplitude $G_{ro}$;
- means for calculating a linear phase correction value $\psi_{pe}(z)$ in the phase-encoding direction which is a function of the square of the image slice location z, the square of the readout gradient amplitude $G_{ro}$ and the square of a phase-encoding gradient amplitude $G_{pe}$;
- means for applying the linear phase corrections $\psi_{ro}(z)$ and $\psi_{pe}(z)$ to the stored NMR signals; and
- means for reconstructing an image from the corrected NMR signals.

5. The NMR system as recited in claim 4 in which the means for calculating the linear phase correction value $\psi_{ro}(z)$ calculates:

$$\psi_{ro}(z) = -\frac{\pi}{B_0 L_{ro}} G_{ro} z^2$$

where:
- $G_{ro}$=readout gradient
- $B_0$=main magnetic field strength
- $L_{ro}$=field of view in the readout direction
- z=slice location along the z-axis
- $\pi$=3.1415926.

6. The NMR system as recited in claim 5 in which the means for calculating the linear phase correction value $\psi_{pe}(z)$ calculates:

$$\psi_{pe}(z) = \lambda(z) = \frac{\gamma z^2}{2B_0} \int_0^{t_{esp}} (G_{ro}^2(t) + G_{pe}^2(t)) dt,$$

- $G_{ro}(t)$=readout gradient
- $G_{pe}(t)$=phase-encoding gradient
- $t_{esp}$=inter-echo spacing for the periodic readout gradient
- $B_0$=main magnetic field strength
- z=slice location along z axis
- $\gamma$=gyromagnetic constant.

7. The NMR system as recited in claim 4 in which the means for calculating the linear phase correction value $\psi_{pe}(z)$ calculates:

$$\psi_{pe}(z) = \lambda(z) = \frac{\gamma z^2}{2B_0} \int_0^{t_{esp}} (G_{ro}^2(t) + G_{pe}^2(t)) dt,$$

- $G_{ro}(t)$=readout gradient
- $G_{pe}(t)$=phase-encoding gradient
- $t_{esp}$=inter-echo spacing for the periodic readout gradient
- $B_0$=main magnetic field strength
- z=slice location along z axis
- $\gamma$=gyromagnetic constant.

* * * * *